United States Patent [19]

Ozaki

[11] Patent Number: 5,319,228

[45] Date of Patent: Jun. 7, 1994

[54] SEMICONDUCTOR MEMORY DEVICE WITH TRENCH-TYPE CAPACITOR

[75] Inventor: Tohru Ozaki, Kanagawa, Japan

[73] Assignee: Kabushiki Kaisha Toshiba, Kawasaki, Japan

[21] Appl. No.: 617,199

[22] Filed: Nov. 23, 1990

[30] Foreign Application Priority Data

Nov. 24, 1989 [JP] Japan .................................. 1-306165

[51] Int. Cl.⁵ ..................... H01L 29/68; H01L 29/78; H01L 29/92
[52] U.S. Cl. ................................... 257/304; 257/305; 257/908; 257/909; 257/910; 257/911
[58] Field of Search .................... 357/23.6 G, 23.6, 54, 357/49, 59 R; 257/301, 304, 305, 379, 390, 908, 909, 910, 911

[56] References Cited

U.S. PATENT DOCUMENTS

| | | | |
|---|---|---|---|
| 4,801,989 | 1/1989 | Taguchi | 357/23.6 G |
| 4,969,022 | 11/1990 | Nishimoto et al. | 357/23.6 G |
| 5,017,981 | 5/1991 | Sunami et al. | 357/23.6 G |

FOREIGN PATENT DOCUMENTS 61-67954  4/1986  Japan .

Primary Examiner—Ngan Ngo
Attorney, Agent, or Firm—Oblon, Spivak, McClelland, Maier & Neustadt

[57] ABSTRACT

A semiconductor memory device having a trench-type capacitor configuration is provided. The device comprises an element isolation insulating film formed on the surface of the substrate in the vicinity of the trenches. The insulating film includes a thickness-reducing region to which the inclined end portion of the capacitor electrode is connected.

6 Claims, 12 Drawing Sheets

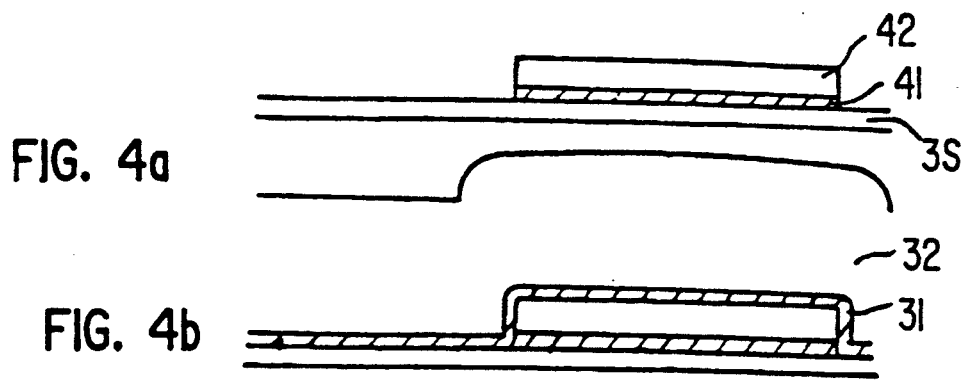
FIG. 4a
FIG. 4b
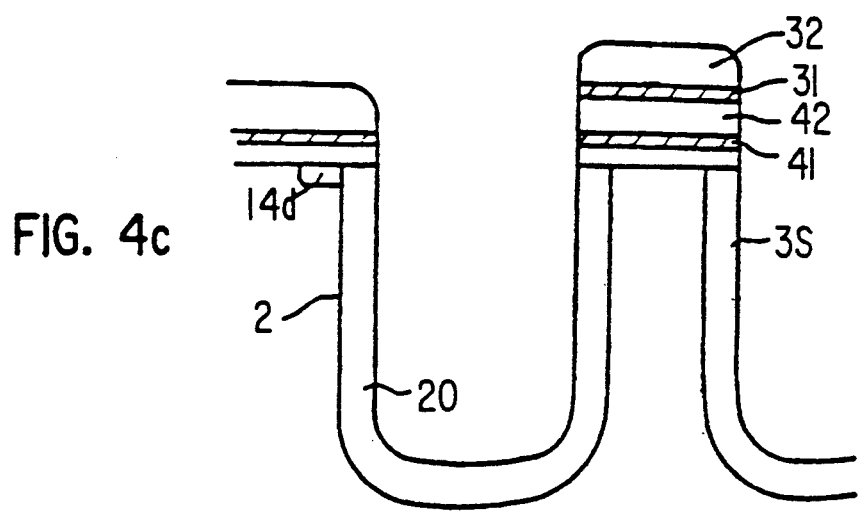
FIG. 4c
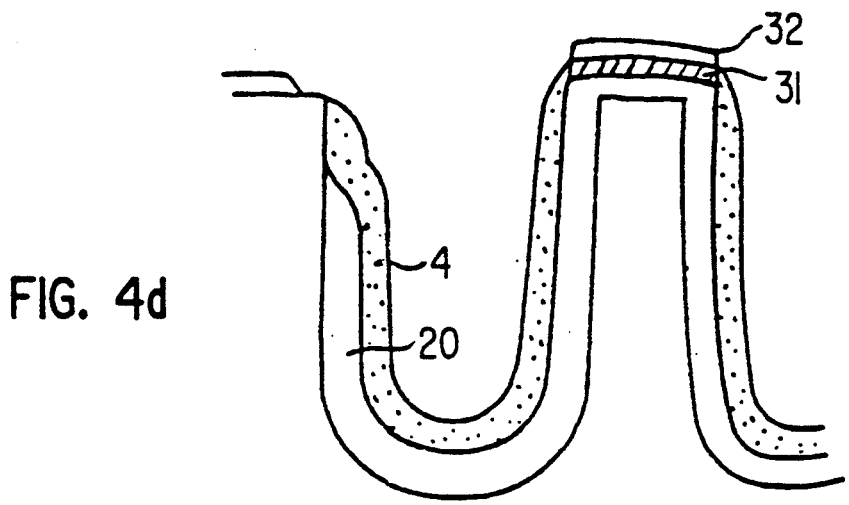
FIG. 4d

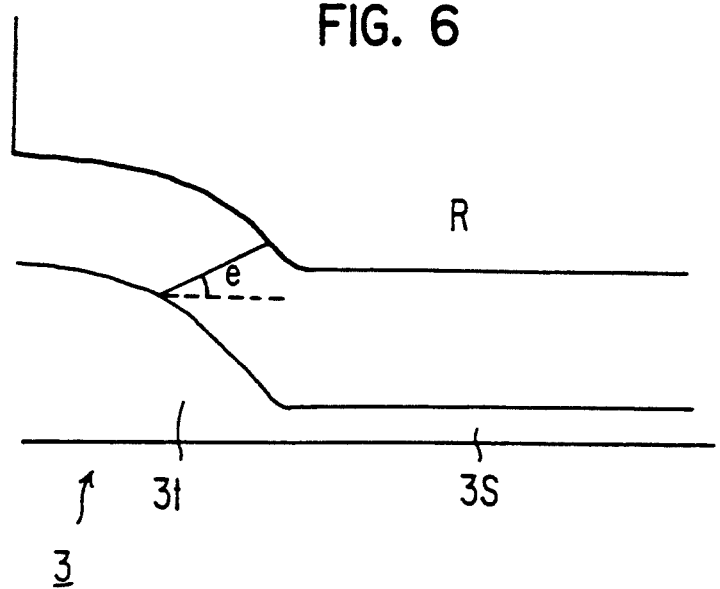

SEMICONDUCTOR MEMORY DEVICE WITH TRENCH-TYPE CAPACITOR

BACKGROUND OF THE INVENTION

1. Field of the Invention:

This invention relates to a semiconductor memory device, and more particularly to a DRAM having a trench-type capacitor configuration wherein memory cells are constituted by MOSFETs and trench MOS capacitors.

2. Description of the Prior Art:

In recent years, considerable progress has been made in semiconductor technology, particularly in achieving high-density integration of semiconductor memory devices. However, the high-density integration inevitably reduces the capacitor chip area that stores information (electric charge). The reduction of the electric charge stored in the capacitors causes software errors such that the memory contents of the capacitors might be erroneously read, or destroyed by alpha rays and the like.

To achieve the high-density integration of semiconductor memory devices while maintaining the large capacitance of the storage capacitors, various techniques including a so-called trench capacitor cell configuration have been disclosed.

A conventional trench capacitor cell configuration will be described with reference to FIGS. 7a through 7c, showing a plan view and cross-sectional views, respectively. In FIGS. 7a through 7c, a trench 102 is formed on the surface of a silicon substrate 101. A capacitor is formed along the sidewalls of the trench 102. Thus, the capacitor area can be increased without an increase in chip area. Each of the memory cells comprises a MOSFET and a MOS capacitor.

In this configuration, a field oxide film 103, which isolates respective element regions, is formed on the surface of a p-type silicon substrate. Each of the MOSFETs is formed in an element region isolated by the field oxide film 103. The MOSFET is constituted by source and drain regions 110 and 114 of n-type layers, and a gate electrode 109 formed therebetween through a gate insulating film 108. A storage node electrode 104 is formed on the inner wall of the trench 102 interposing a thermal oxide film 100 therebetween. A capacitor insulating film 105 is formed on the surface of the storage node electrode 104. Further, a plate electrode 106 is buried in the trench 102. The storage node electrode 104, the capacitor insulating film 105 and the plate electrode 106 constitute the MOS capacitor. A word line 109 is formed on the plate electrode 106 through an interlayer insulating film 107.

As described above, the trench capacitor cell configuration utilizing the inner walls of the trench capacitor can be increased up to several times that of the planar configuration. As a result, the chip area for memory cell can be reduced without a decrease in the amount of electric charge to be stored.

However, in the above-described conventional configuration, an undesirable short-circuit layer 200 might be formed in a region from the end portion of the plate electrode 106 to the substrate surface, as shown in FIG. 7c. The short-circuit layer 200 is composed of residual material which should have been removed while the word line 109 was formed by use of an anisotropic etching technique. The short-circuit layer 200 inevitably short-circuits between the gate electrode 109 which serves as the word line (not shown in FIG. 7C) and the adjoining word line 109'. The short-circuit layer 200 is left unetched because of the following reasons. Specifically, a conductive layer (dotted line), which is to be etched, has regions of different thicknesses indicated by arrows t1 and t2 with respect to the etching direction, i.e., the vertical direction, as shown in FIG. 7C. Thus, when the word line 109 is formed by the use of the anisotropic etching technique, the region of arrow t1, which corresponds to the flat portion of the plate electrode 106, can be completely removed. However, if the etching ends on the completion of removing the region of arrow t1, the region of arrow t2, which corresponds to the inclined end portion of the plate electrode 106, cannot be completely removed. The residual material forms the short-circuit layer 100. It is possible to completely remove the region of arrow t2, when the word line 109 is formed by use of the anisotropic etching technique. However, this causes the word line 109 to be excessively etched, and thereby a prescribed thickness thereof cannot be maintained. As a result, the resistance of the word line 109 inevitably increases, and causes a decrease in operations. Further, the thinned word line 109 is easily broken.

More specifically, the cause of the occurrence of the short-circuit layer 200 will be described with reference to FIG. 8, which is a schematic illustration. In FIG. 8, the plate electrode 106 is formed on the field oxide film 103 having a substantially flat surface of uniform thickness. The plate electrode 106 comprises a flat portion 106a and an inclined portion 106b having an inclination angle $\theta$. The bottom portion of the inclined portion 106b is defined as an inclined portion's bottom length, and is represented by G (hereinafter simply referred to as bottom length G). As shown in FIG. 7C, the occurrence of the short-circuit layer 200 is caused by the difference between etching lengths of arrows t1 and t2 with respect to the flat portion 106a and the inclined portion 106b shown in FIG. 8. Assume that the bottom length G is designed to be greater and thereby the inclination angle $\theta$ of the inclined portion 106b becomes smaller. This reduces the difference between etching lengths of arrows t1 and t2. As a result, the occurrence of the short-circuit layer 200 can be avoided. However, in order to meet the recent requirements of the miniaturization and higher-density of elements, the bottom length G must be as small as possible. Thus, the inclination angle $\theta$ inevitably becomes greater, and thereby the difference between the etching lengths of arrows t1 and t2 also increases.

SUMMARY OF THE INVENTION

Accordingly, one object of this invention is to provide a semiconductor memory device having a trench-type capacitor configuration, in particular, a DRAM that can meet the requirements of miniaturization and higher-density of elements without occurrence of short-circuit layers and damage to the word lines.

Briefly, in accordance with one aspect of this invention, there is provided a semiconductor memory device which comprises a single conductive-type semiconductor substrate having a surface, a plurality of trenches formed in the surface of the substrate, each of the trenches having an opening, a plurality of MOS transistors formed on the surface of the substrate, each of the MOS transistors being formed in a region adjoining the trenches, an element isolation insulating film formed on the surface of the substrate in the vicinity of the trenches, the insulating film having a first thinnest region in the peripheries of the openings of the trenches, a second thickest region at portions separated from the openings of the trenches, and a thickness-reducing region formed integrally between the first and second regions, and a plurality of capacitors formed respectively in the trenches, each of the capacitors having a first electrode, a capacitor insulating film formed on the first electrode and a second electrode formed on the capacitor insulating film, the second electrode extending to the periphery of one of the trench openings, the second electrode having an end portion disposed on the thickness-reducing region of the element isolation insulating film.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawings, wherein:

FIG. 1b is a cross-sectional view taken along line A-B of FIG. 1a;

FIG. 1c is a cross-sectional view taken along line C-D of FIG. 1a;

FIGS. 3a through 3g and FIGS. 3A through 3G are cross-sectional views illustrating the processes of manufacturing the device according to the first embodiment of the present invention shown in FIG. 1a, the illustrations of FIGS. 3a through 3g correspond to the cross section taken along line A-B of FIG. 1a, and the illustrations of FIGS. 3A through 3G correspond to the cross section taken along line C-D of FIG. 1a;

FIGS. 4a through 4e and FIGS. 4A through 4E are cross-sectional views illustrating the processes of manufacturing a device according to a second embodiment of the present invention, the illustrations of FIGS. 4a through 4e correspond to the cross section taken along line A-B of FIG. 1a, and the illustrations of FIGS. 4A through 4E correspond to the cross section taken along line C-D of FIG. 1a;

FIGS. 5a through 5e and FIGS. 5A through 5E are cross-sectional views illustrating the processes of manufacturing a device according to a third embodiment of the present invention, the illustrations of FIGS. 5a through 5e correspond to the cross section taken along line A-B of FIG. 1a, and the illustrations of FIGS. 5A through 5E correspond to the cross section taken along line C-D of FIG. 1a;

FIG. 6 is a schematic diagram for explaining the essential portion of the device according to the third embodiment of the present invention.

FIG. 7b is a cross-sectional view taken along line A-B of FIG. 7a;

FIG. 7c is a cross-sectional view taken along line C-D of FIG. 7a; and

DESCRIPTION OF THE PREFERRED EMBODIMENTS

Figure 1A:
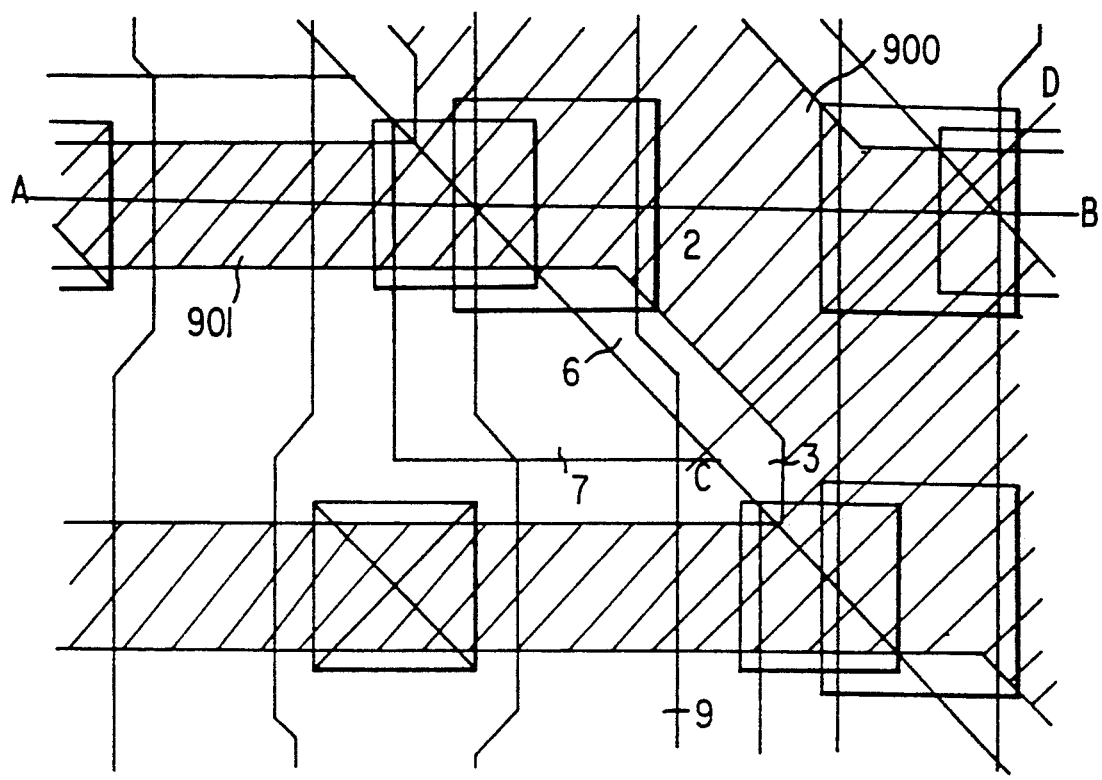
FIG. 1a is a plan view illustrating a first embodiment according to the present invention.

Referring now to the drawings, wherein like reference numerals designate identical or corresponding parts throughout the several views, and more particularly to FIGS. 1a through 1c thereof, a first embodiment of this invention will be described.

Figure 1B:
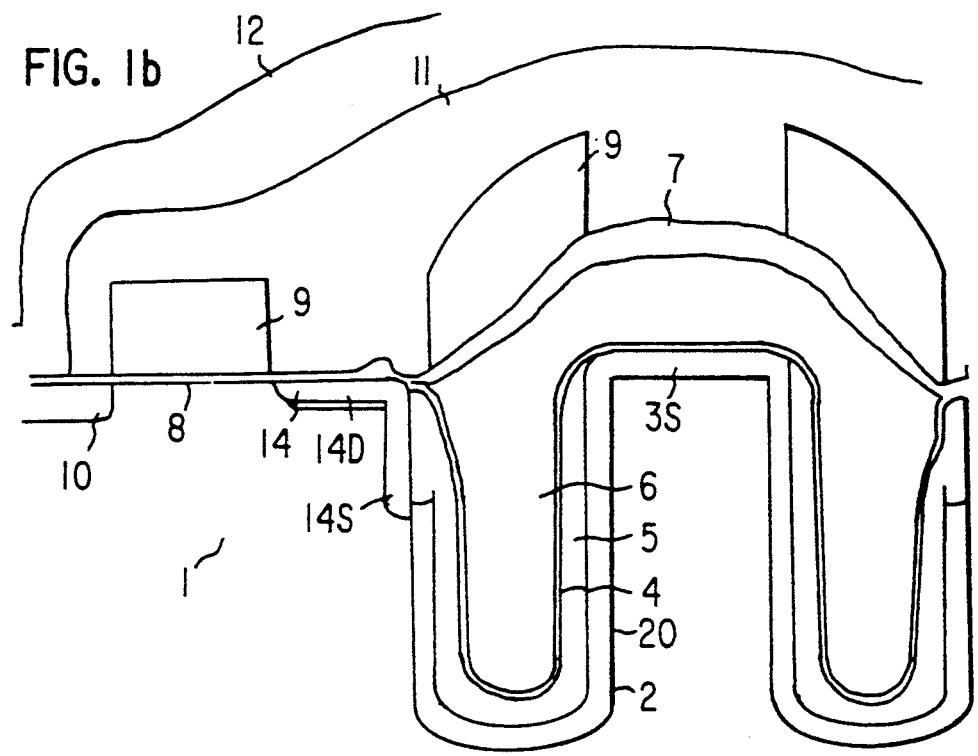
Figure 1C:
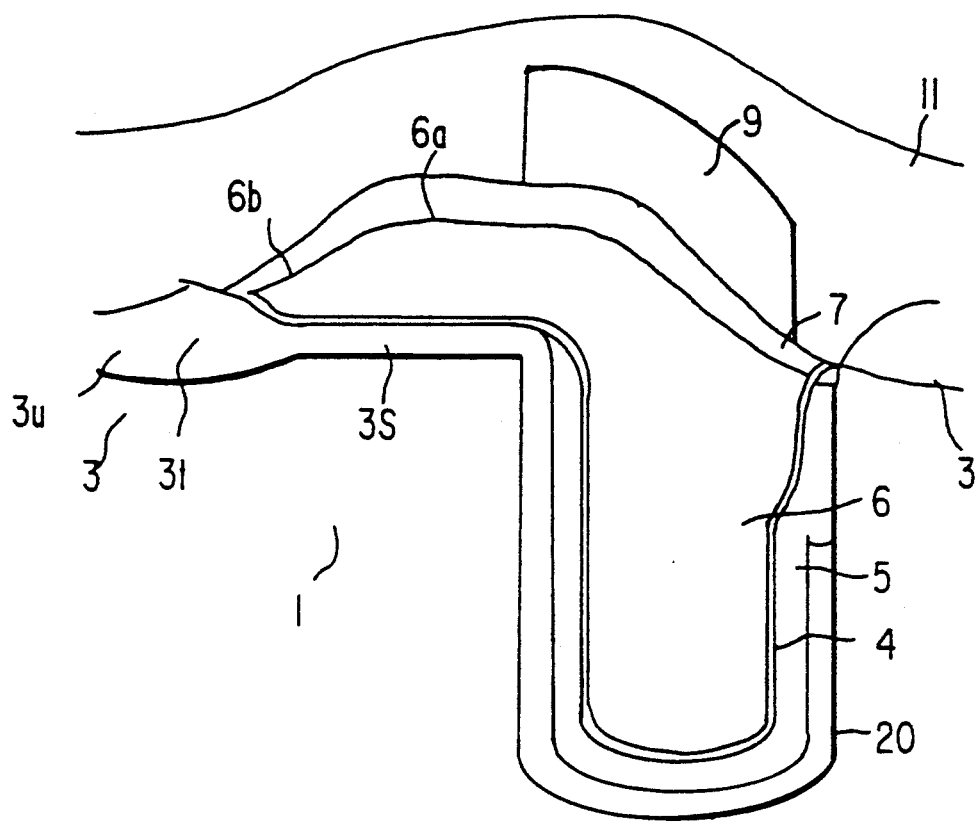

FIGS. 1a through 1c show a DRAM having trench-type MOS capacitors according to a first embodiment of the present invention. In FIGS. 1a through 1c, trenches 2 and a field oxide film 3 for use in element isolation are formed on a p-type silicon substrate 1.

Further, MOSFETs are formed in element regions isolated by the field oxide film 3. Each of the MOSFETs comprises a gate electrode 9 (which also serves as a word line 9), a source region 10 and a drain region 14. The gate electrode 9 is formed interposing a gate insulating film 8. The source and drain regions 10 and 14 which are made of n-type layers are formed in self-aligning manner with respect to the gate electrode 9. Further, MOS capacitors are formed so as to be connected to the drain regions 14. Each of the MOS capacitors comprises a storage node electrode 4, a capacitor insulating film 5 and a plate electrode 6. The storage node electrode 4 is made of a polycrystalline silicon film, and is formed on the inner walls of a trench 2 interposing a thermal oxide film 20. The capacitor insulating film 5, which is made of a two-layer film, i.e., a silicon nitride film and a silicon oxide film, is formed on the surface of the storage node electrode 4. The plate electrode 6, which is made of a polycrystalline silicon film, is buried in the trench 2. Further, a diffusion layer 14s is formed in the vicinity of the trench 2, and one end of the diffusion layer 14s is connected to the storage node electrode 4. The other end thereof is connected to the drain region 14 of the MOSFET. The source region 10 of the MOSFET is connected to one of bit lines 12. Further, the gate electrodes 9 of the respective MOSFETs are arranged continuously in one direction of the memory cell matrix so as to constitute word lines. The thus formed element regions are coated with a silicon oxide film 11 which is formed by use of a CVD technique. Further, the bit lines 12 are formed on the silicon oxide film, 11 so as to be connected to the source regions 10 through contact holes.

Specifically, the field oxide film 3 comprises a first thinnest region 3s, a second thickest region 3u and a thickness-reducing region 3t, as shown in FIG. 1c. Further, the portion of the plate electrode 6, which extends to the surface of the substrate 1, comprises a flat portion 6a and an inclined end portion 6a and an inclined end portion 6b. The inclined end portion 6b of the plate electrode 6 is positioned on the thickness-reducing region 3t of the field oxide film 3. Most of the flat portion 6a of the plate electrode 6 is positioned on the first region 3s of the field oxide film 3. The inclinded end portion 6b of the plate electrode 6 is shaped along the upper surface of the thickness-reducing region 3t of the field oxide film 3. Thus, as the film thickness of the thickness-reducing region 3t of the field oxide film 3 reduces, the film thickness of the inclined end portion 6b of the plate electrode 6 increases.

In accordance with this embodiment, the inclination angle of the inclined end portion 6b of the plate electrode 6 can be decreased without an increase in the bottom length G, which will be described below.

Figure 2:
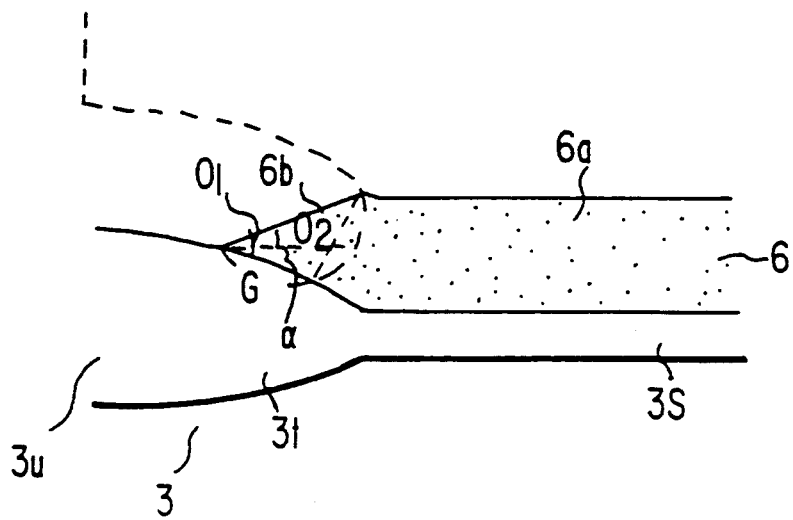
FIG. 2 is a schematic diagram for explaining the essential portion of a device according to the first embodiment of the present invention.

The device of this embodiment will be described more specifically with reference to the schematic illustration of FIG. 2. In FIG. 2, the field oxide film 3 comprises a first thinnest region 3s, a thickness-reducing region 3t whose film thickness gradually reduces toward the first thinnest region 3s, and a second thickest region 3u. The plate electrode 6, which has been uniformly formed on the field oxide film 3, is etched using a photo resist R as a mask indicated by the dotted line shown in FIG. 2. The thus etched plate electrode 6 comprises a flat portion 6a and an inclined end portion 6b, as shown in FIG. 2. Assume that the thickness t of the plate electrode 6 and the bottom length G are determined under the same condition as those in the conventional specifications shown in FIG. 8. In this case, an angle $\theta_2$ formed between the horizontal plane and the upper surface of the inclined end portion 6b can be expressed by the following equation:

$$\theta_2 = \theta_1 - \alpha$$

where $\theta_1$ represents an angle formed between the tangent line of the thickness-reducing region 3t and the upper surface of the inclined end portion 6b, and $\alpha$ represents an angle formed between the tangent line of the reigon 3t and the horizontal plane.

Figure 8:
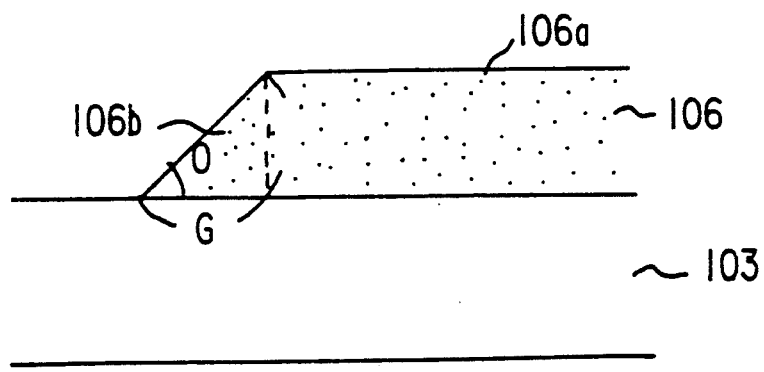
FIG. 8 is a schematic diagram for explaining the essential portion of the conventional device shown in FIG. 7.

The inclined angle $\theta$ in the conventional device shown in FIG. 8 corresponds to the angle $\theta_2$ formed between the horizontal plane and the upper surface of the inclined end portion 6b of the plate electrode 6. Thus, as can be seen from FIG. 2, the angle $\theta_2$ can be formed smaller than the conventional inclined angle $\theta$ by the angle $\alpha$.

As described above, the inclination angle of the inclined end portion of the plate electrode can be formed smaller without an increase in the bottom length thereof. This prevents the occurrence of the short-circuits between the word line and other portions. Next, the processes of manufacturing the DRAM according to the present invention will be described with reference to FIGS. 3a through 3g and FIGS. 3A and 3G. FIG. 3a through 3g are cross-sectional views taken along the line A-B of FIG. 1a. FIGS. 3A through 3G are cross-sectional views taken along the line C-D of FIG. 1a.

Figure 3A:
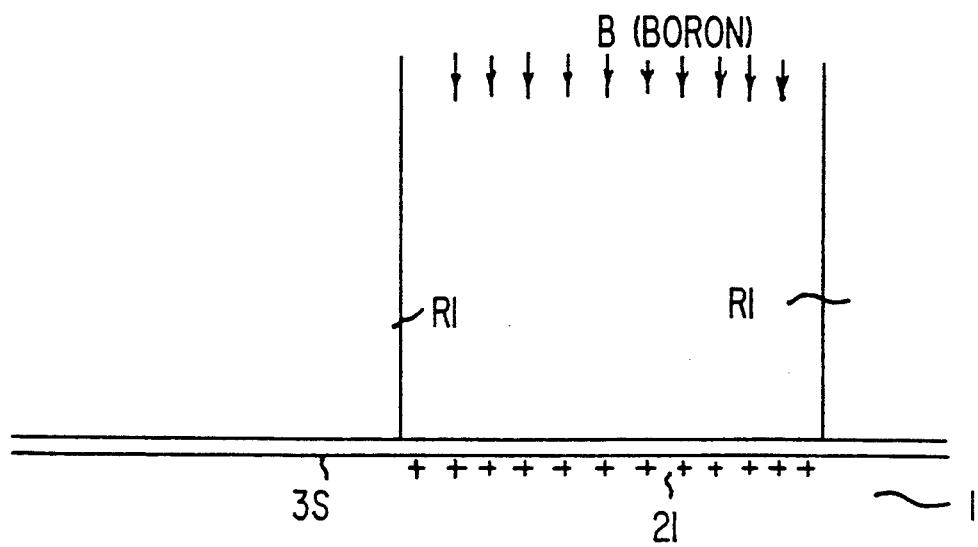

As shown in FIGS. 3a and 3A, an element isolation insulating film 3 is formed on the surface of a P-type silicon substrate having a specific electric resistance of about 5 Ωcm. This is performed by use of a LOCOS (local oxidation) technique. The element isolation insulating film 3u is made of a silicon oxide film of about 700 nm thick, and is formed in the regions other than a plate electrode-forming region 900 and an element region 901. Thereafter, boron ions are selectively implanted into the film 3u using a photoresist film R1 as a mask so as to form a channel stopper layer 21 of a high impurity concentration.

Figure 3B:
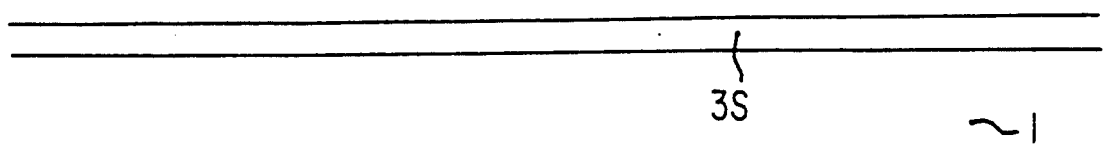
Figure 3C:
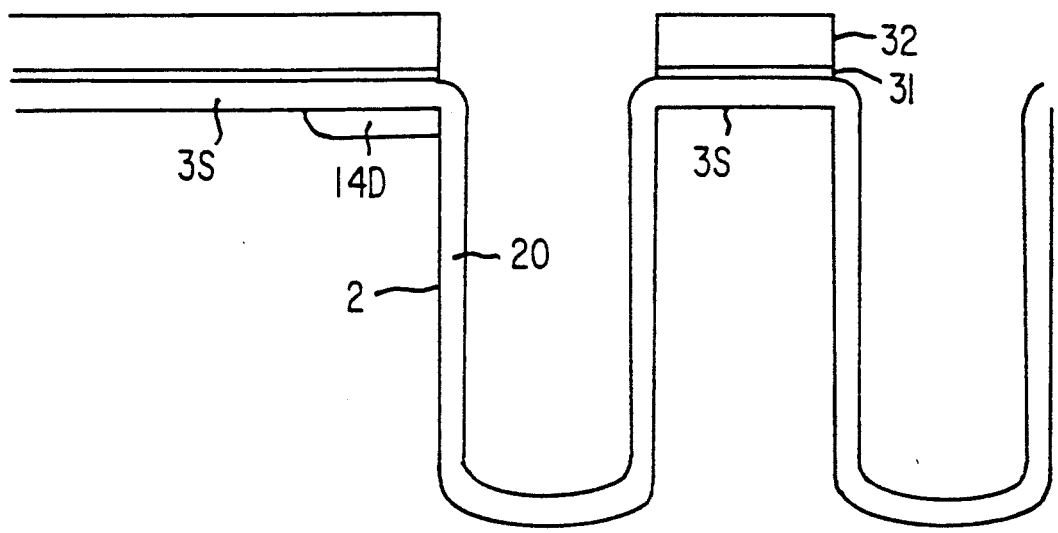

Next, a silicon oxide film 3s of about 1000 Å thick is formed in the plate electrode-forming region 900 and the element region 901, as shown in FIGS. 3b and 3B. This is performed by use of a thermal oxidation technique. Thereafter, as shown in FIG. 3c, an n-type layer 14d is formed in the periphery of the trench-forming region in order to ensure the connection between the storage node electrode 4 and the drain region 14. Next, the trench 2 is formed using a two-layer film, i.e., a silicon nitride film 31 and a silicon oxide film 32, as a trench mask. This is performed by use of an anisotropic etching technique. Further, a silicon oxide film 20 is formed on the inner wall of the trench 2. This is performed by use of a thermal oxidation technique.

Figure 3D:
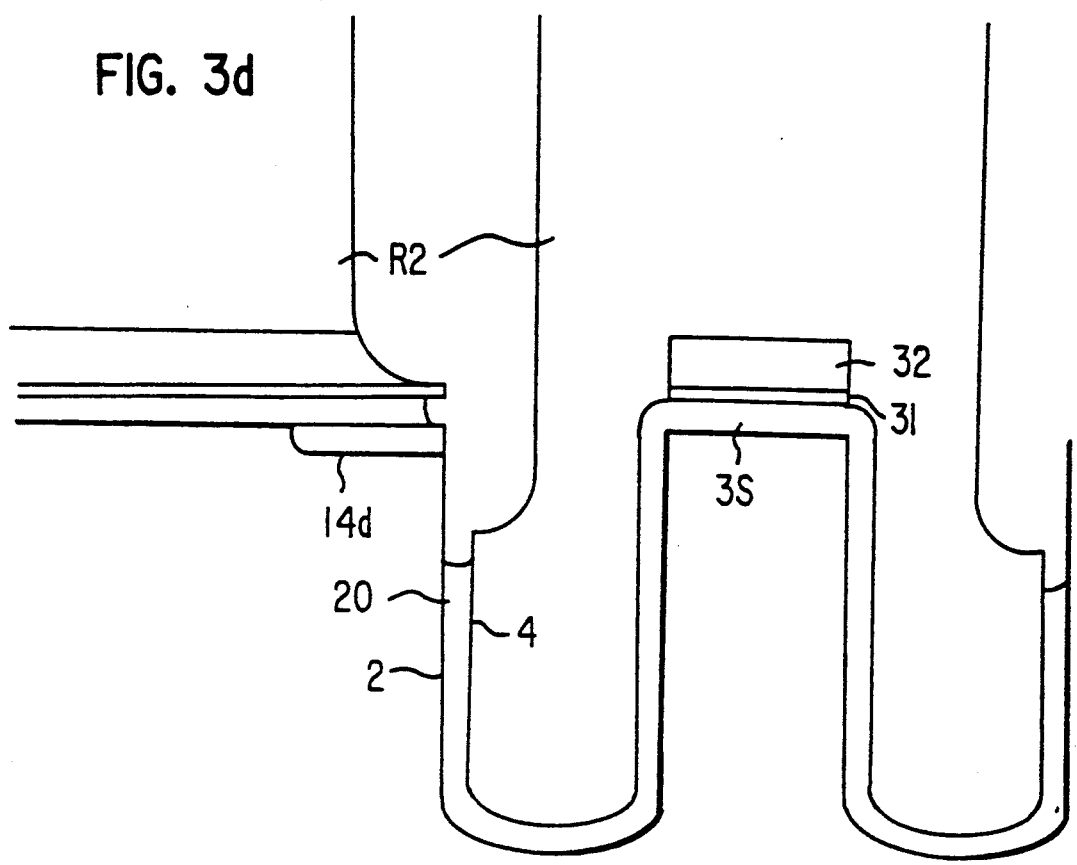
Figure 3E:
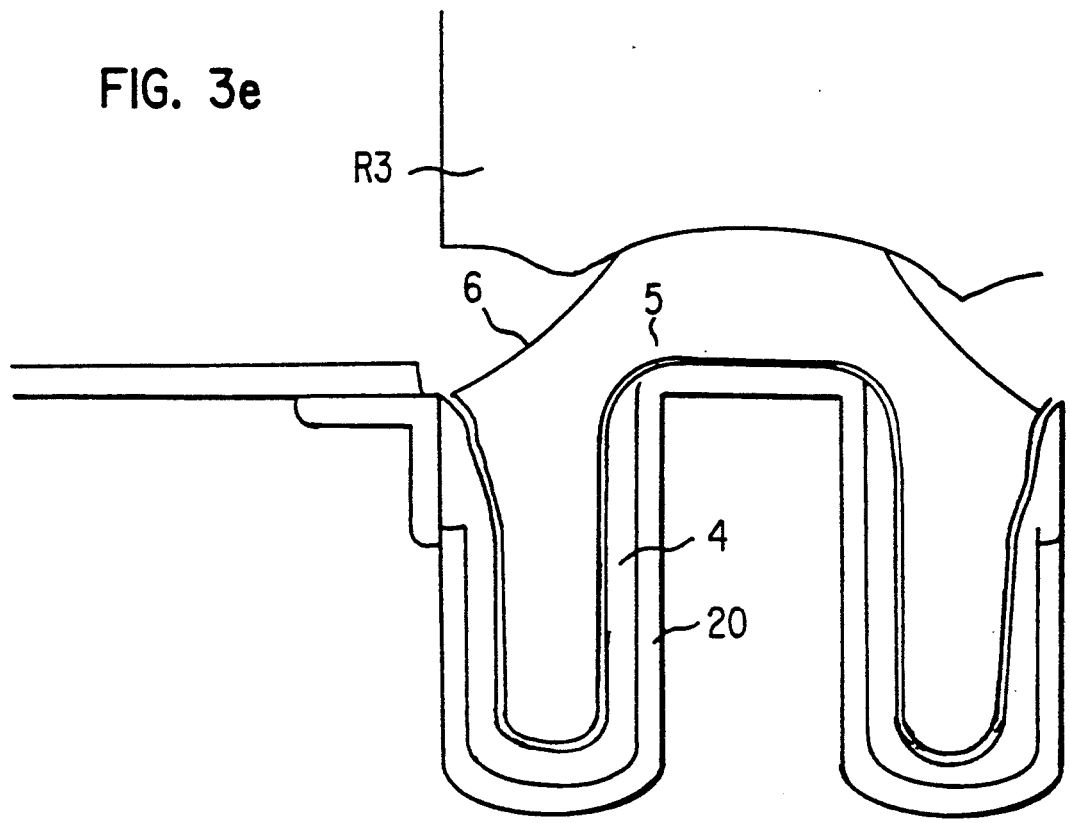

Next, as shown in FIGS. 3d and 3D, a contact which serves to make connection with the storage electrode 4, is formed on the part of the sidewall of the trench 2 in the following manner. Specifically, a photoresist film R2 is formed on the part of the sidewall (made of silicon oxide film 20) of the trench 2 as a mask. Thereafter, a hole is made in the film 20 by use of an isotropic etching technique using ammonium fluoride ($NH_4OH$). The photoresist film R2 is then removed, and thereafter, the two-layer film (films 31 and 32) is removed. As a result, the storage node electrode 4, the capacitor insulating film 5 and the plate electrode 6 can be formed, as shown in FIGS. 3e and 3E.

The processes of removing the two-layer film (films 31 and 32) will now be described in more detail. Specifically, after the removal of the photoresist film R2, the surface of the sidewall is slightly oxidized, and a silicon nitride film is formed thereon so as to protect the sidewall of the field oxide film 3. Under this condition, the silicon oxide film 32 is removed by use of ammonium fluoride. Thereafter, the silicon nitride film 31 is removed by use of a CDE (chemical dry ethcing) technique. Finally, the thin silicon oxide film, which has been formed on the contact portion of the storage node electrode 4, is removed by use of weak ammonium fluoride. As a result, a part of the substrate 1 can be exposed.

Figure 3F:
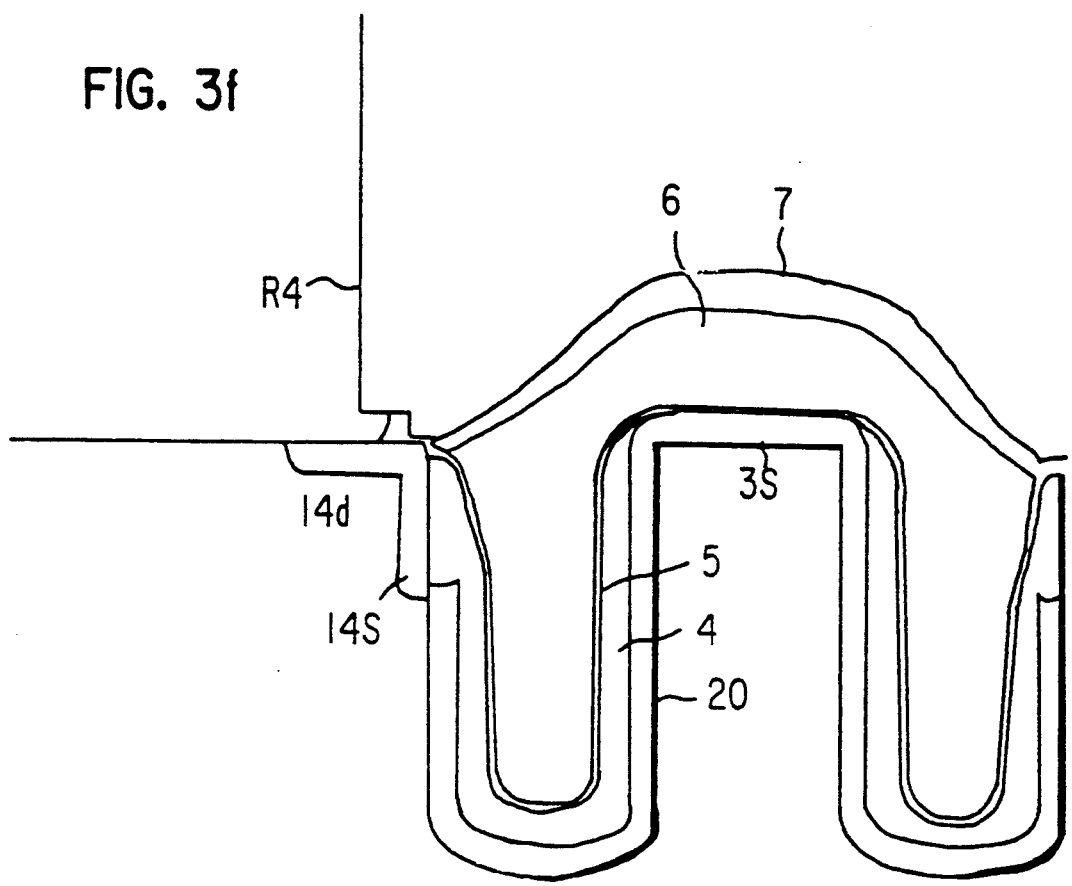

After the removal of the trench mask, a polycrystalline silicon film of about 50 nm thick is deposited by use of the CVD technique. Thereafter, a prescribed doping is performed by the ion implantation of arsenic or phosphorus, or by phosphorus diffusion. In this case a diffusion layer 14s, shown in FIG. 3f, is formed in a region being in contact with the sidewall of the trench 2. Thus, the layer 14s can be electrically connected to the diffusion layer 14d which has previously been formed.

The capacitor insulating film 5, which is a two-layer film of silicon nitride film and silicon oxide film, and the polycrystalline silicon film are buried in the trench 2. Thereafter, the plate electrode 6 is oxidized by use of a low-temperature oxidation technique. Thus, a silicon oxide film is formed which serves as an interlayer insulating film 7. Further, the thus formed silicon oxide film is patterned using the photoresist film R4 as a mask by use of ammonium fluoride. As a result, a MOS trench capacitor can be formed.

Figure 3G:
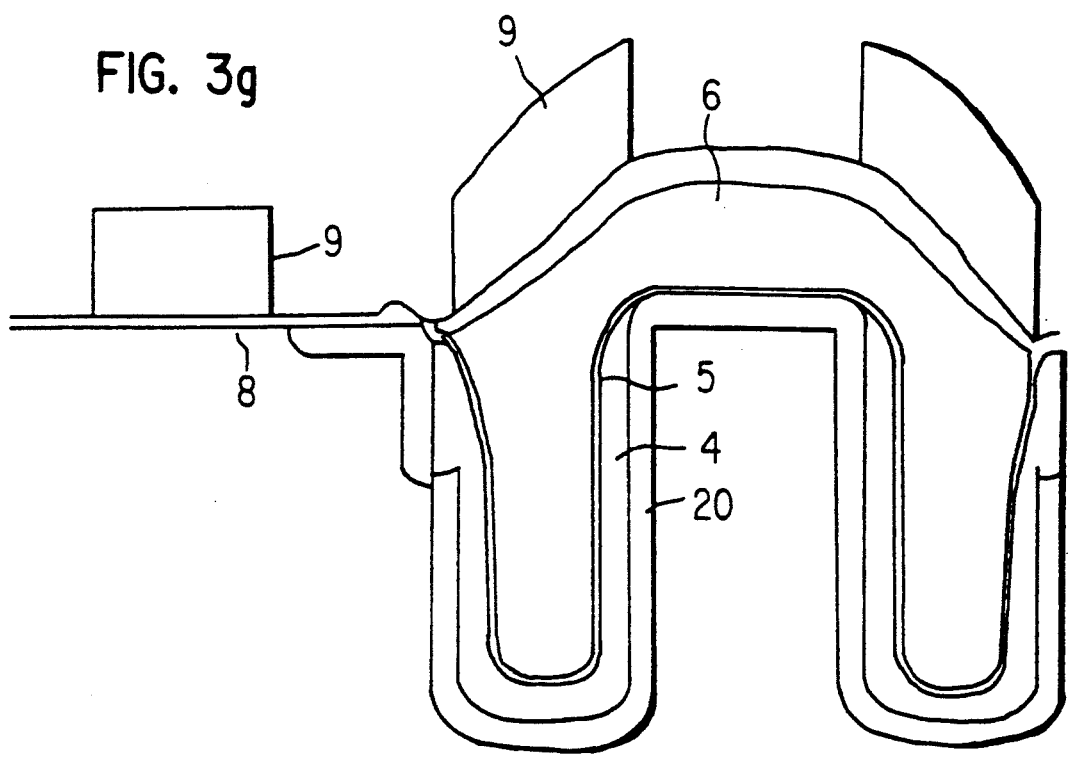

Next, a MOSFET is formed in the following manner. Specifically, as shown in FIGS. 3g and 3G, a gate insulating film 8 made of a thermally oxidized film of about 15 nm is formed. Further, a polycrystalline silicon film which serves as a gate electrode 9, is deposited on the gate insulating film 8. Thereafter, a photoresist film is formed in a trench region along the word line. The gate electrode 9, which serves as the word line, is formed using the photoresist film as a mask. This is performed by use of a reactive ion etching technique.

Thereafter, the substrate surface is exposed by use of a photo lithograph technique and a reactive ion etching technique. Next, n-type layers 10 and 14 are covered with an interlayer insulating film 11 of a silicon oxide film formed by a CVD technique.

Finally, contact holes are made in the thus formed interlayer insulating film, and materials such as polycrystalline silicon and aluminum are deposited filling the contact holes. Thereafter, the bit line 12 is patterned by use of a photolithograph technique so as to complete a DRAM.

In the above-described DRAM according to the present invention, the inclined end portion of the plate electrode reaches the thickness-reducing region of the field oxide film. As a result, the inclination angle of the inclined end portion of the plate electrode can be formed smaller without an increase in the bottom length thereof.

Figure 4E:
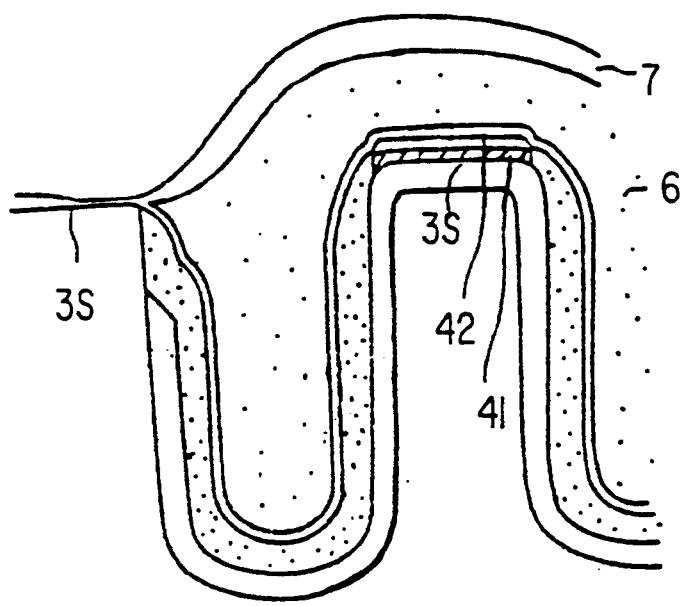

Next, a second embodiment according to the present invention will be described with reference to FIGS. 4A through 4E. This embodiment differs from the first embodiment in the following manner. Specifically, a silicon nitride film 41 and a silicon oxide film 42 are formed in order to protect a silicon oxide film 3s under the plate electrode 6. More specifically, the surface of a p-type silicon substrate 1 is field-oxidized in the same manner as in the first embodiment. Thereafter, a silicon oxide film of about 700 nm thick is formed in a prescribed region. The prescribed region excludes a plate electrode-forming region 900 and an element region 901. Next, boron ions are selectively implanted into the prescribed region so as to form a channel stopper layer 21 of a high impurity concentration. Next, a silicon oxide film 3s of about 1000 Å thick is formed by use of a thermal oxidation technique in the plate electrode-forming region 900 and the element region 901. Thereafter, as shown in FIGS. 4a and 4A, a silicon nitride film 41 and a silicon oxide film 42 are formed in the plate electrode-forming region 900. The films 41 and 42 serve to protect the silicon oxide film 3s under the plate electrode 6. Thereafter, an n-type layer 14d is formed in the periphery of a trench-forming region, as shown in FIGS. 4b and 4B. The layer 14d ensures the connection between a storage node electrode 4 and a drain region 14. Next, a two-layer film of a silicon nitride film 31 and a silicon oxide film 32 is deposited, and patterned in the prescribed manner. As a result, a trench mask is formed, as shown in FIGS. 4c and 4C. Thereafter, a trench 2 is formed by use of an anisotropic etching technique through the trench mask. Next, a silicon oxide film 20 is formed on the inner wall of the trench 2 by use of a thermal oxidation technique. Next, a contact hole is formed in a portion of the sidewall of the trench 2 in order to make connection with the storage node electrode 4, as shown in FIGS. 4d and 4D. Further, the inclined end portion E of the plate electrode 6 is patterned so as to reach the thickness-reducing region 3t of the field insulating film 3, as shown in FIGS. 4e and 4E. Thus, the inclination angle of the inclined end portion E of the plate electrode 6 can be formed smaller without an increase in the bottom length thereof. Thereafter, a MOSFET is formed by use of a conventional technique, and thereby a DRAM according to the present invention is completed. In this embodiment, the insulating film 3s, which is formed under the plate electrode 6, is covered with the protective films 41 and 42. Thus, the thickness of the insulating film 3s is not reduced in the processes of manufacturing the DRAM. As a result, the initial thickness of the insulating film 3s can be smaller in the first embodiment.

Figure 5A:
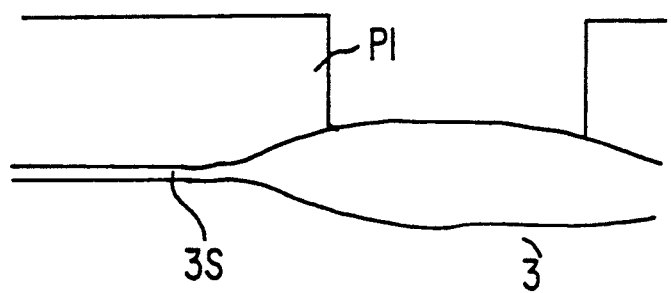
Figure 5B:
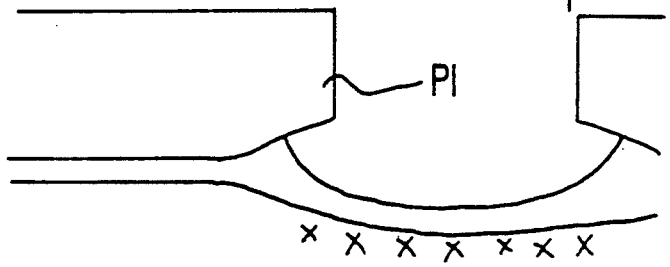
Figure 5C:
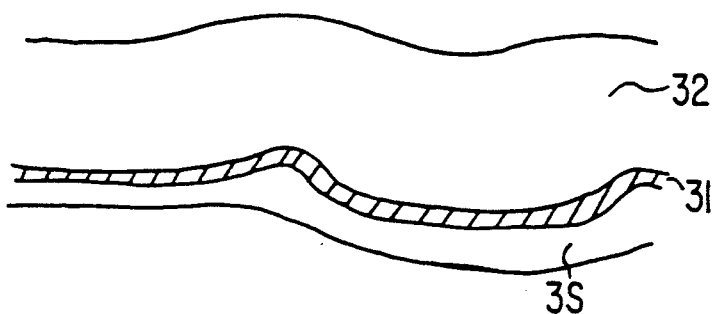

Next, a third embodiment according to the present invention will be described with reference to FIGS. 5a through 5e and FIGS. 5A through 5E. In this embodiment, a field oxide film is formed by use of the conventional technique. Thereafter, the field oxide film in a plate electrode-forming region 900 is partially removed so as to form a thinner silicon oxide film 3s. Next, the surface of a p-type silicon substrate 1 is oxidized. Thereafter, a field oxide film 3 made of a silicon oxide film of about 700 nm thick is formed in a region other than element region 901. Next, a photoresist film P1 is used as a mask, as shown in FIGS. 5b and 5B and field oxide film 3 is selectively and partially etched to form a thin silicon oxide film 3S. Then, by using the same mask, boron ions are selectively implanted into the prescribed region so as to form a channel stopper layer 21 having a high impurity concentration is formed. Next, the surface of the film 3s is again oxidized. Further, a two-layer film of a silicon nitride film 31 and a silicon oxide film 32 is deposited in the oxidized surface of the film 3s, as shown in FIGS. 5c and 5C. The two-layer film is patterned so as to form a trench mask. Thereafter, a trench 2 is formed through the trench mask by use of an anisotropic etching technique.

Figure 5D:
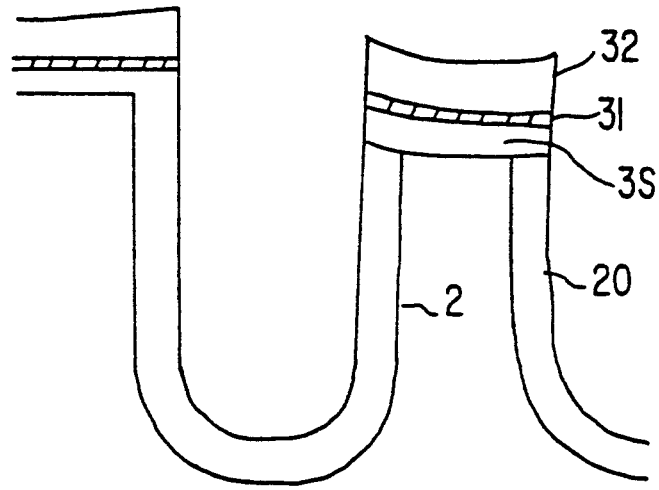
Figure 5E:
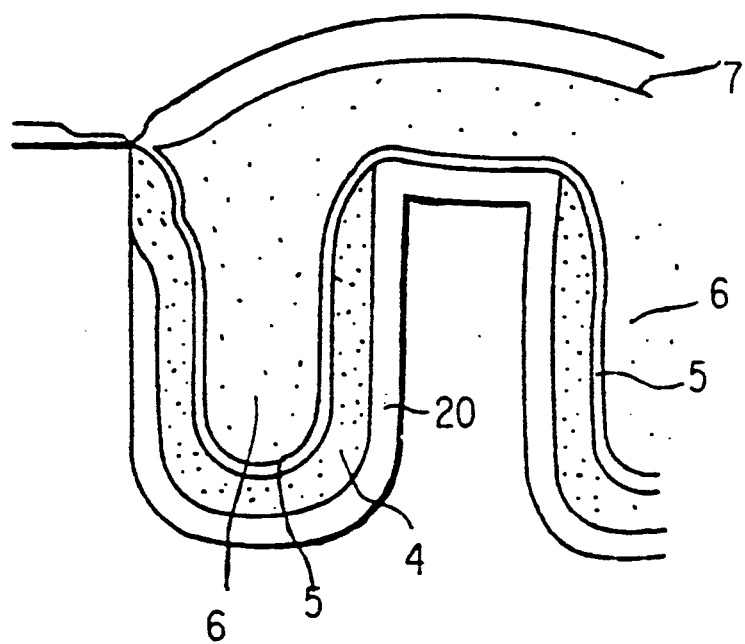
Figure 7A:
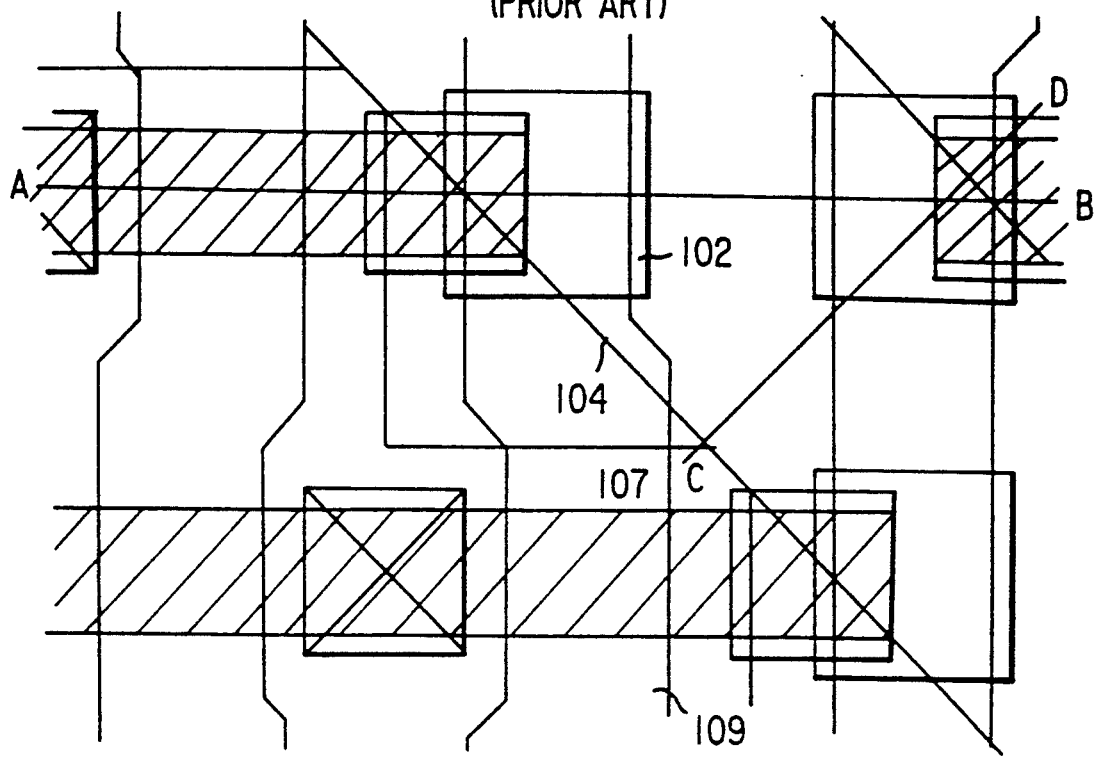
FIG. 7a is a plan view illustrating a conventional device.
Figure 7B:
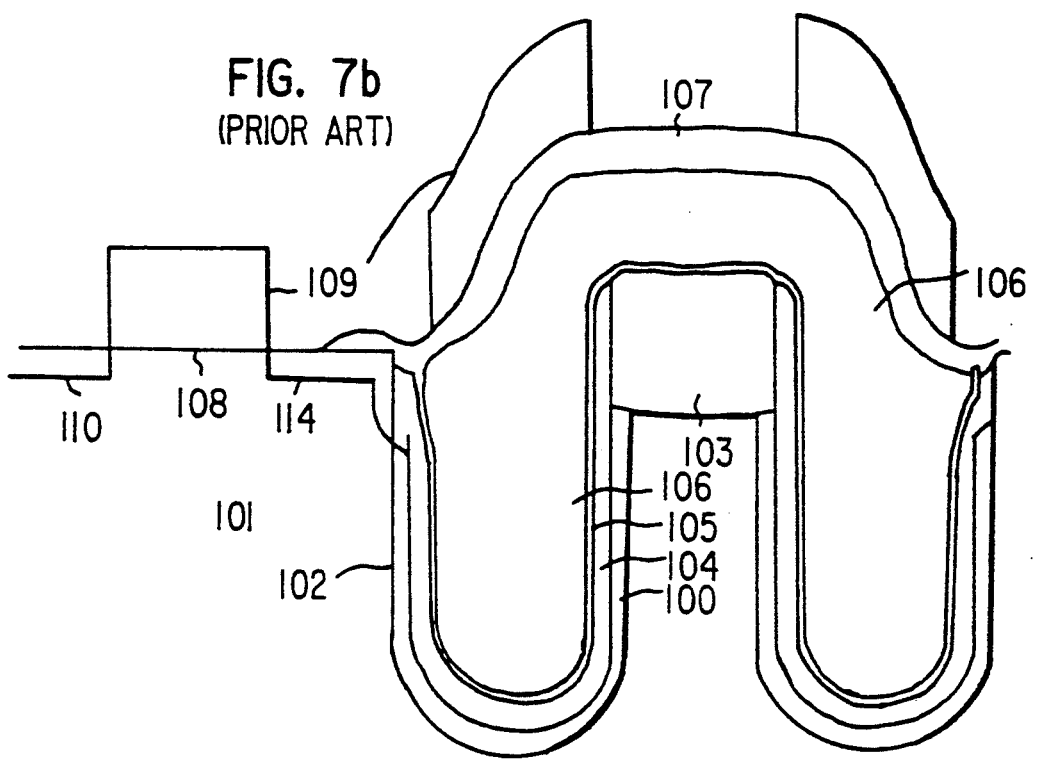
Figure 7C:
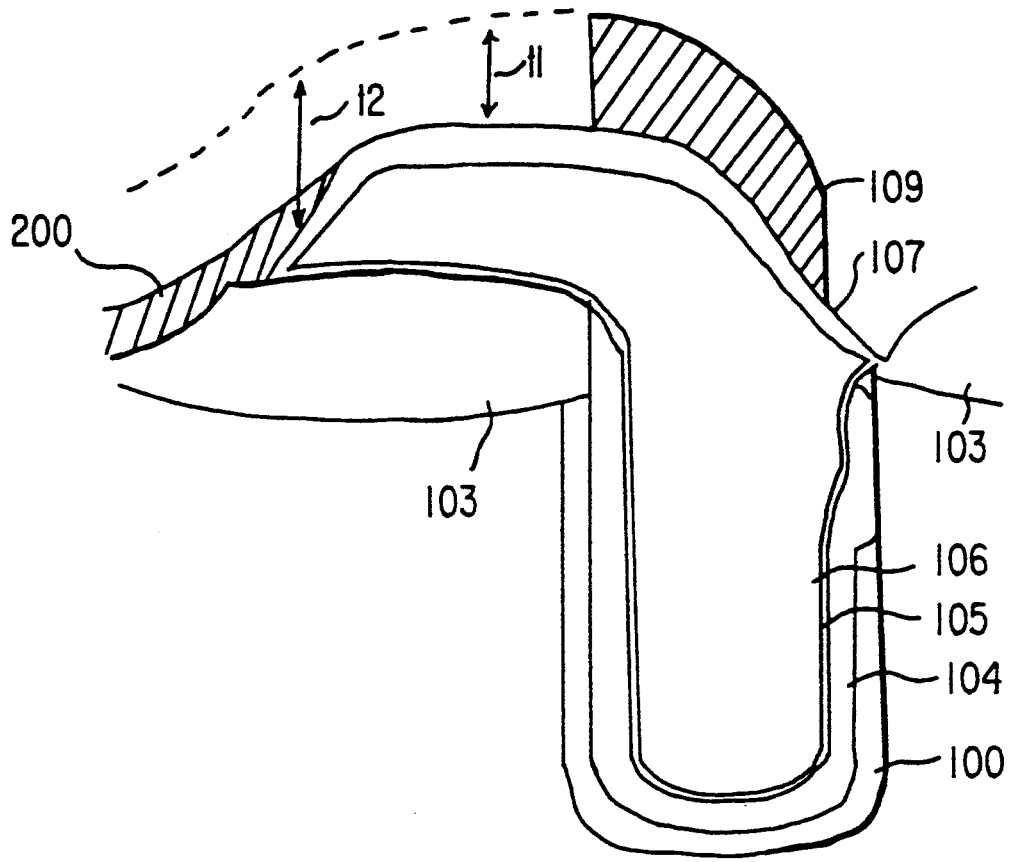

Next, a silicon oxide film 20 is formed on the inner wall of the trench 2 by use of a thermal oxidation technique, as shown in FIGS. 5d and 5D. Next, a contact portion, which is to be connected to a storage node electrode 4, is formed on part of the sidewall of the trench 2. Thereafter, the storage node electrode 4, a capacitor insulating film 5 and a plate electrode 6 are formed as shown in FIGS. 5e and 5E. The plate electrode 6 is formed such that the inclined end portion E thereof reaches the thickness-reducing region 3t of the field oxide film 3. Further, the surface of the plate electrode 6 is oxidized, and thereby an interlayer insulating film 7 is formed.

In this embodiment, the inclination angle of the inclined end portion E of the plate electrode 6 can be formed smaller without an increase in the bottom length thereof. Thereafter, a MOSFET is formed by use of a conventional technique, and thereby a DRAM according to the present invention is completed.

FIG. 6 schematically illustrates the essential portion of the device according to this embodiment. As can be seen from FIG. 6, the inclination angle of the inclined end portion of the plate electrode 6 can be smaller than that in the first and second embodiments. This is because the thickness-reducing region 3t of the field oxide film 3 is steeper than that in the first and second embodiments.

As described above, according to the present invention, the field oxide film has a thickness-reducing region to which the inclined end portion of the plate electrode is connected. Thus, the inclination angle of the inclined end portion of the plate electrode can be smaller. As a result, there can be provided a highly reliable DRAM that can meet the requirements of miniaturization and higher-density of elements without occurrence of short-circuit layers and damage to the word lines. Further, in the first embodiment, the field oxide film is not formed in the plate electrode-forming region. Thus, this region can also serve as the SDG region. As a result, the above-described DRAM can be easily manufactured only with changes of masks in the process of forming the field oxide film.

Moreover, according to the second embodiment, the process of removing the field oxide film in the plate electrode-forming region is added to the processes of element isolation. Thus, the field oxide film under the plate electrode can be thinner than that in other regions. As a result, the above-described DRAM can be manufactured more easily.

Obviously, numerous additional modifications and variations of the present invention are possible in light of the above teachings. It is therefore to be understood that within the scope of the appended claims, the invention may be practiced otherwise than as specifically described herein.

What is claimed is:

1. A semiconductor memory device comprising:
   a single conductive-type semiconductor substrate having a surface;
   a plurality of trenches formed in the surface of said substrate, each of said trenches having an opening;
   a plurality of MOS transistors formed on the surface of said substrate, each of said MOS transistors being formed in a region adjoining said trenches;
   an element isolation insulating film formed on the surface of said substrate in the vicinity of said trenches, said insulating film having a first thinnest region at peripheries of the openings of said trenches, a second thickest region at portions separated from the openings of said trenches, and a region of decreasing thickness formed integrally between said first and second regions;
   a plurality of capacitors formed respectively in said trenches, each of said capacitors having a first electrode, a capacitor insulating film formed on said first electrode, and a second electrode formed on the capacitor insulating film, said second electrode extending to the periphery of one of said trench openings, said second electrode having an end portion disposed on said region of decreasing thickness of said element isolation insulating film; and
   an angle formed between a plane formed by an end upper surface of said second electrode near said region of decreasing thickness and a plane parallel to a surface of said first thinnest region is smaller than an angle formed between the plane formed by said end upper surface of said second electrode and a plane formed by an upper surface of said element isolation insulating film in said region of decreasing thickness.

2. The device of claim 1, wherein said substrate is made of silicon, said first and second electrodes are made of polycrystalline silicon, and said capacitor insulating film is a two-layer film made of silicon nitride and silicon oxide.

3. The device of claim 1, wherein said first thinnest region, second thickest region and region of decreasing thickness are so formed that they commonly possess the same plane.

4. A semiconductor memory device comprising:
   a first conductive-type semiconductor substrate having a surface;
   a plurality of trenches formed in the surface of said substrate, each of said trenches having an opening;
   a plurality of MOS transistors having a pair of regions being source and drain regions, a gate insulating film formed between said pair of regions, and a gate electrode formed on said gate insulating film;
   a plurality of second conductive-type connection regions, each of said connection regions adjoining said trenches, and each of said connection regions being exposed to an inner wall of each of said trenches;
   an element isolation insulating film formed on the surface of said substrate in the vicinity of said trenches and on the inner wall of each of said trenches such that a portion of each of said connection regions is exposed, said insulating film having a first thinnest region at peripheries of the openings of said trenches and on the inner wall of each of said trenches, a second thickest region at portions separated from the openings of said trenches, and a region of decreasing thickness formed integrally between said first and second regions;
   a plurality of capacitors formed respectively in said trenches, each of said capacitors having a first electrode, a capacitor insulating film formed on said first electrode, and a second electrode formed on said capacitor insulating film, said second electrode extending to the periphery of one of said trench openings, said second electrode having an end portion disposed on said region of decreasing thickness of said element isolation insulating film; and
   an angle formed between a plane formed by an end upper surface of said second electrode near said region of decreasing thickness and a plane parallel to said first thinnest region is smaller than an angle formed between the plane formed by said end upper surface of said second electrode and a plane formed by an upper surface of said element isolation insulating film in said region of decreasing thickness.

5. The device of claim 4, wherein said substrate is made of silicon, said first and second electrodes are made of polycrystalline silicon, and said capacitor insulating film is a two-layer film made of silicon nitride and silicon oxide.

6. The device of claim 4, wherein said first thinnest region, second thickest region and region of decreasing thickness are so formed that they commonly posses the same plane.

* * * * *